US010297950B2

(12) United States Patent
Wei

(10) Patent No.: US 10,297,950 B2
(45) Date of Patent: May 21, 2019

(54) MAGNETIC CONNECTOR AND GARMENT AND PROTECTIVE CLOTHING FOR INTELLIGENT HEATING

(71) Applicant: Shenzhen Pomagtor Precision Electronics Co., LTD, Guangdong (CN)

(72) Inventor: Zhengpeng Wei, Guangdong (CN)

(73) Assignee: Shenzhen Pomagtor Precision Electronics Co., LTD, Guangdong (CN)

( * ) Notice: Subject to any disclaimer, the term of this patent is extended or adjusted under 35 U.S.C. 154(b) by 0 days.

(21) Appl. No.: 15/934,158

(22) Filed: Mar. 23, 2018

(65) Prior Publication Data
US 2018/0212359 A1  Jul. 26, 2018

Related U.S. Application Data

(63) Continuation of application No. PCT/CN2017/118041, filed on Dec. 22, 2017.

(30) Foreign Application Priority Data

Dec. 23, 2016  (CN) .......................... 2016 1 1206241

(51) Int. Cl.
*H01R 13/62* (2006.01)
*A41D 1/00* (2018.01)
(Continued)

(52) U.S. Cl.
CPC ......... *H01R 13/6205* (2013.01); *A41D 1/005* (2013.01); *A41D 13/0051* (2013.01);
(Continued)

(58) Field of Classification Search
CPC .... H01R 13/625; H01R 11/30; H05K 1/0212; H05K 1/0272
(Continued)

(56) References Cited

U.S. PATENT DOCUMENTS 4,025,964 A * 5/1977 Owens .............. A61M 39/0247
128/899
7,331,793 B2 * 2/2008 Hernandez .............. H01F 38/14
439/38
(Continued)

FOREIGN PATENT DOCUMENTS

CN       103247901 A    8/2013
CN       104124583 A    10/2014
(Continued)

OTHER PUBLICATIONS

International Search Report and Written Opinion for International Application No. PCT/CN2017/118041 dated Mar. 27, 2018.

*Primary Examiner* — Alexander Gilman
(74) *Attorney, Agent, or Firm* — Marshall, Gerstein & Borun LLP

(57) ABSTRACT

Disclosed is a magnetic connector comprising a body having a mounting cavity, the body comprising a PCB received in the mounting cavity, a first conductive terminal soldered to one side of the PCB and extending toward an opening of the mounting cavity, a first magnet disposed along the periphery of the PCB and on the same side as the first conductive terminal. The body further has a first anti-off device which is formed with an insulating bushing enclosing the first conductive terminal or the first magnet. The magnetic connector provided by the present invention has advantages that the connection is more stable and more durable, that the service life is longer, and that a certain degree of solid connection can be maintained even if a part of the anti-off device has failed, which is of a good fault tolerance.

9 Claims, 13 Drawing Sheets

US 10,297,950 B2
Page 2

(51) Int. Cl.
*A41D 13/005* (2006.01)
*H05K 1/02* (2006.01)
*H05K 1/18* (2006.01)
*H05B 1/02* (2006.01)
*H01R 11/30* (2006.01)

(52) U.S. Cl.
CPC .......... *H01R 11/30* (2013.01); *H05B 1/0272* (2013.01); *H05K 1/0212* (2013.01); *H05K 1/181* (2013.01); *A41D 2400/12* (2013.01); *H05B 2203/036* (2013.01)

(58) Field of Classification Search
USPC .......................................................... 439/39
See application file for complete search history.

(56) References Cited

U.S. PATENT DOCUMENTS

| | | | | |
|---|---|---|---|---|
| 9,515,420 B2* | 12/2016 | Daoura | ............. | H01R 13/6205 |
| 9,548,559 B2* | 1/2017 | Zhou | ................. | H01R 13/6205 |
| 9,941,627 B2* | 4/2018 | Esmaeili | ................ | H01R 12/61 |
| 9,983,747 B2* | 5/2018 | Poupyrev | ............. | D03D 1/0088 |
| 9,991,628 B2* | 6/2018 | Daoura | ............. | H01R 13/6205 |
| 2007/0026695 A1* | 2/2007 | Lee | ...................... | H01R 12/592 439/37 |
| 2013/0023816 A1* | 1/2013 | Bachinski | .......... | A61N 1/36014 604/20 |
| 2014/0371568 A1* | 12/2014 | Selby | ..................... | H01R 13/11 600/388 |
| 2015/0093920 A1* | 4/2015 | Colantuono | ....... | H01R 13/6205 439/39 |
| 2015/0303619 A1* | 10/2015 | Kockx | .................. | A61N 1/048 607/149 |
| 2015/0364863 A1* | 12/2015 | Andrus | ................. | A61M 1/127 439/39 |
| 2017/0125940 A1* | 5/2017 | Karagozler | ........ | H01R 13/6205 |
| 2018/0040975 A1* | 2/2018 | Davies | ................ | H01R 13/629 |
| 2018/0212359 A1* | 7/2018 | Wei | ........................ | H01R 11/30 |

FOREIGN PATENT DOCUMENTS

| | | |
|---|---|---|
| CN | 204156545 U | 2/2015 |
| CN | 106505363 A | 3/2017 |
| CN | 206619752 U | 11/2017 |

\* cited by examiner

MAGNETIC CONNECTOR AND GARMENT AND PROTECTIVE CLOTHING FOR INTELLIGENT HEATING

CROSS REFERENCE TO RELATED APPLICATIONS

This application is a continuation of International Application No. PCT/CN2017/118041, filed on Dec. 22, 2017, which is based upon and claims priority to Chinese Patent Application No. 201611206241.7, filed on Dec. 23, 2016, the entire contents of each of which are incorporated herein by reference.

TECHNICAL FIELD

The present invention relates to the field of charging technology, and particularly to a magnetic connector and a garment and protective clothing for intelligent heating.

BACKGROUND

With the development of technology and fast-pace of life, the requirements for charging technology are also increasing. Many electronic devices, especially the wearable devices, need to be charged more conveniently and quickly. Therefore, magnetic connectors come into view. Current magnetic connectors have a poor fixation when attached together through attraction between magnets, and the attached magnetic connectors are easy to detach from each other.

SUMMARY

In order to overcome the above defects in the prior art, the present invention provides a magnetic connector and a garment or protective clothing for intelligent heating.

According to a first aspect of the present invention, there is provided a magnetic connector comprising a body having a mounting cavity, the body comprising:
 a PCB received in the mounting cavity;
 a first conductive terminal soldered on a side of the PCB and extending toward an opening of the mounting cavity; and
 a first magnet disposed along the periphery of the PCB and on the same side as the first conductive terminal;
 wherein the body is further provided with a first anti-off device dedicated to the first conductive terminal or the first magnet to prevent point detachment, the first anti-off device being provided with an insulating bushing embracing the first conductive terminal or the first magnet, the first conductive terminal or the first magnet being placed in a first limiting hole of the insulating bushing, and the insulating bushing is configured to:
 receive at least a portion of an external matching second conductive terminal when the first conductive terminal is in contact with the second conductive terminal oppositely in an axial direction and forms electric conduction to limit displacement of the second conductive terminal in a direction transverse to the axial direction; or
 receive at least a portion of an external matching second magnet when the first magnet is magnetically attracted to the second magnet oppositely in an axial direction to limit displacement of the second magnet in a direction transverse to the axial direction.

Due to the provision of a detachment prevention device dedicated to each of the conductive terminals or each of the magnets, the magnetic connector provided in the above embodiment has advantages of a more stable and durable connection thereof with an external one, a longer service life, and good fault tolerance, namely, a certain degree of solid connection can be maintained even if malfunction of a part of the anti-off device occurs.

In some embodiments, the body is circular; the first anti-off device comprises an insulator dedicated to the first conductive terminal; the first magnet is annular; and the first conductive terminal is a spring probe. The magnetic connector in this embodiment has an advantage of freely rotating 360 degrees to accommodate connections at more angles.

In some embodiments, the body may be of square shape; the first anti-off device comprises an insulating bracket dedicated to the first magnet; and the first magnet is located on either side of the square body.

In some embodiments, the first anti-off device includes an insulating bracket with a plurality of limiting holes arranged at fixed intervals which can make the anti-off device bear substantially the same force.

In some embodiments, the body may be of square shape; the first anti-off device may include an insulating bracket dedicated to the first conductive terminal; and the first magnet is hollow cylindrical. In this embodiment, due to a larger magnet area, the magnet has a more attractive force, and the connection of the magnetic connector with other ones is more stable.

According to a second aspect of the present invention, there is provided a magnetic connector comprising a body, the body comprising:
 a PCB (Printed Circuit Board),
 a second conductive terminal soldered to a side of the PCB, and
 a second magnet disposed along the periphery of the PCB and on the same side as the second conductive terminal;
 wherein the body is further provided with a second anti-off device dedicated to the second conductive terminal or the second magnet; the second anti-off device is formed with an insulating bushing embracing the second conductive terminal or the second magnet; the second conductive terminal or the second magnet is located in a second limiting hole of the insulating bushing; and the insulating bushing is configured so that
 the second conductive terminal or the second magnet protrudes from the second limiting hole, or
 a portion of the insulating bushing surrounding the second conductive terminal, protrudes with respect to a plane where the second magnet locates.

The magnetic connector provided in the above embodiment has advantages that the connection between it and a external one is more stable and more durable, that the service life is longer, and that a certain degree of solid connection can be maintained even if a part of the anti-off device has failed, i.e., that fault tolerance is good, due to the provision of a detachment prevention device dedicated to each of the conductive terminals or each of the magnets.

In some embodiments, the body is circular; the second anti-off device comprises an insulator dedicated to the second conductive terminal; the second magnet is annular; and the second conductive terminal is a spring probe. The magnetic connector in this embodiment has the advantage of freely rotating 360 degrees to accommodate connections at more angles.

In some embodiments, the body is square; the second anti-off device comprises an insulating bracket dedicated to the second magnet; and the second magnet located on either side of the square body.

In some embodiments, the second anti-off device includes an insulating bracket with a plurality of limiting holes arranged at fixed intervals. Fixed intervals can make the anti-off device withstand substantially the same force.

In some embodiments, the body is square; the second anti-off device includes an insulating bracket dedicated to the second conductive terminal; and the second magnet is hollow cylindrical. In this embodiment, due to a larger magnet area, the magnet has a more attractive force, rendering a more reliable connection between the magnetic connector and other connector is more stable.

According to a third aspect of the present invention, there is provided a garment or protective clothing for intelligent heating, comprising:

a magnetic connector according to the second aspect of the present invention;

a rear cover for locking with the magnetic connector;

a first carrier and a second carrier, wherein the first carrier or the second carrier is provided with an opening, and the magnetic connector is locked with the rear cover through the opening and fixed on the first carrier or the second carrier; and a heating unit fixed between the first carrier and the second carrier and not exposed to the outside, wherein a heating part of the heating unit is connected to the magnetic connector through a wiring harness.

According to other aspects of the present invention, there is provided a magnetic electrode button including a magnetic electrode button male base and a magnetic electrode button female base. The magnetic electrode button male base and the magnetic electrode button female base each contain a magnet. The magnetic electrode button male base and the magnetic electrode button female base are connected to each other by means of magnet attraction and are conductive. Conductive terminals of the magnetic electrode button male base and the magnetic electrode button female base are abutted and connected to each other by means of magnet attraction.

The magnetic electrode button male base and the magnetic electrode button female base each include a positive electrode conductor, a negative electrode conductor, and a PCB. The negative electrode conductor and the PCB are soldered together to form a negative electrode of a circuit. The positive electrode conductor is soldered on the PCB to form a positive electrode of the circuit.

In use, the magnetic electrode button female base or the magnetic electrode button female base is fixed on a carrier for using as a button. The magnetic electrode button female base or the magnetic electrode button female base is fixed on the carrier through an opening. The carrier can be connected to the magnetic electrode button male base and the magnetic electrode button female base for charging or data transmission.

The beneficial effects of the above structure is that, magnets arranged in the structures of the magnetic electrode button female base and the magnetic electrode button female base can attract each other so that the magnetic electrode button male base and the magnetic electrode button female base can be firmly connected together to realize circuit's breakover or data conduction and achieve charging function.

In some embodiments, the magnetic electrode button female base includes a first positive electrode conductor, a first negative electrode conductor, a first magnet, a first insulator, a first peripheral insulator, a first PCB, a first latch, a first conductive wiring harness and a first outer insulating cover. The first positive electrode conductor is located at the center of the magnetic electrode button male base; the first insulator is arranged between the first negative electrode conductor and the first positive electrode conductor; the first latch is soldered to the first PCB; the first magnet is located between the first negative electrode conductor and the first outer insulating cover; and the first conductive wiring harness is connected between the first outer insulating cover and the first PCB.

In some embodiments, the magnetic electrode button female base includes a second peripheral insulator, a second negative electrode conductor, a second positive electrode conductor, a second magnet, a second insulator, a second latch, a second PCB, and a second conductive wiring harness. The second peripheral insulator, the second negative electrode conductor, the second magnet and the second insulator are injection-molded as a first component; the second positive electrode conductor, the second latch and the second PCB are soldered as a second component; the first component and the second component are locked and connected together by ultrasonic welding or riveting; the second positive electrode conductor is soldered to the second PCB to form a positive electrode of a circuit; and the second negative electrode conductor and the second PCB are soldered to form a negative electrode of the circuit.

In some embodiments, the magnetic electrode button female base is placed on the carrier which may be a cloth or a plastic housing. The carrier may be placed between the first component and the second component of the magnetic electrode button female base.

In some embodiments, the first peripheral insulator, the first insulator, the first negative electrode conductor and the first magnet of the magnetic electrode button female base are connected as a third component; the first PCB, the first latch, the first conductive wiring harness, the first positive electrode conductor and the first outer insulating cover are connected as a fourth component. Particularly, the carrier is located between the third component and the fourth component of the magnetic electrode button female base.

In some embodiments, the magnetic electrode button female base further includes a second outer insulating cover. The carrier may be located between the second peripheral insulator and the second outer insulating cover.

In some embodiments, the carrier may be located between the second peripheral insulator and the second latch.

In some embodiments, the carrier is a wearable housing or clothing. The beneficial effects are that the male base or the female base of the magnetic electrode button arranged on the clothing or the wearable housing can be charged in time as required and can be used as a decoration such as a button when not in use, which is convenient for carrying and quick application.

In some embodiments, the material of the latch is brass; the material of the magnet is aluminum-ferrum-boron. The components' strength can be kept while the thickness keeps small. The structures of the magnetic electrode button male base and the magnetic electrode button female base can be attached fittingly, reducing the volume of space.

The arrangement of the positive electrode conductor of the magnetic electrode button at the center and the negative electrode conductor at the periphery enables the magnetic electrode button male base and the magnetic electrode button female base to connect more firm and positionally accurate, which realizes continuous conduction of circuit and data to achieve charging functions.

Compared with the prior art, each component of the magnetic connector has the required strength while the volume is reduced, saving manufacturing cost, and has the advantages of simple structure, space saving, convenient portability and application in a variety of charging areas.

In the magnetic connector and the garment or protective clothing for intelligent heating in accordance with the present invention, due to the provision of an anti-off device dedicated to a conductive terminal or a magnet, especially when there is a large number of posts included in conductive terminal and at least two segments of magnet, each post of the conductive terminal or each segment of the magnet subjected to detachment protection can be fixed in a targeted manner. Even if one of the point disconnection prevention devices has malfunctioned, two matching magnetic connectors can also be maintained to be connected stably by other point disconnection prevention devices, thereby greatly improving the stability and durability of the magnetic connectors when connected to each other.

DETAILED DESCRIPTION

The present invention will be further described in detail below with reference to the accompanying drawings.

Figure 1:
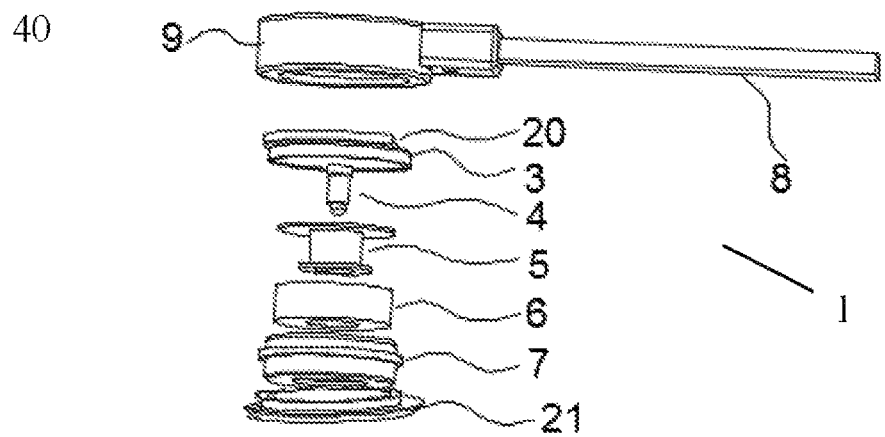
FIG. 1 is an exploded view of a magnetic connector according to a first embodiment of the present invention.
Figure 2:
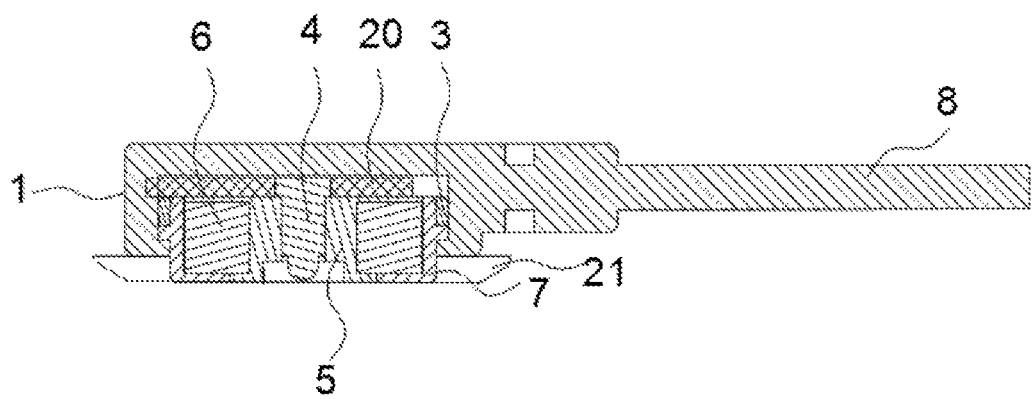
FIG. 2 is a cross-sectional view of the magnetic connector shown in FIG. 1.

FIGS. 1 and 2 schematically show a magnetic connector 1 according to a first embodiment of the present invention. As shown in FIG. 1, a body of the magnetic connector has a circular cross section and includes a first positive electrode conductor 4, a first insulator 5, a first magnet 6, a first negative electrode conductor 7, a first latch 3, an outer insulating cover 9, a PCB 20 and a first peripheral insulator 21.

The outer insulating cover 9 forms the body of the magnetic connector. The body has a mounting cavity (not shown). The PCB 20 is received in the bottom of the mounting cavity. An opening of the mounting cavity faces the first peripheral insulator 21. In this embodiment, the first positive electrode conductor 4 is a first conductive terminal disposed on a side of the PCB 20 in a direction towards the opening of the mounting cavity and located at the center of the PCB 20. The first magnet 6 is arranged along the circumference of the PCB 20 and on the same side as the first conductive terminal. The magnet has a hollow cylindrical shape, in which the hollow portion is configured to be in muff-coupling with the first conductive terminal. That is, the first conductive terminal extends outwards through the hollow portion of the magnet. The first insulator 5 is a first anti-off device dedicated to the first positive electrode conductor 4 and comprises a hollow cylinder and a circular portion bordering the hollow cylinder. The hollow cylinder surrounds the first positive electrode conductor 4, and the circular portion, the center of which is hollow for passing the first positive electrode conductor 4, is used to prevent the first magnet from touching the PCB 20. The insulator can be imagined having a "hat" shape which is hollow at the top. The first negative electrode conductor 7 serves to surround the first magnet 6. The first latch 3 may be set between the positive electrode conductor 4 and the PCB and soldered onto the PCB for fixing the first positive electrode conductor 4, the first insulator 5, the first magnet 6, and the first negative electrode conductor 7, etc. on the PCB 20. The outer insulating cover 9 and the first peripheral insulator 21 enclose all the above components in the mounting cavity of the body to prevent the occurrence of electric leakage phenomenon.

Figure 8A:
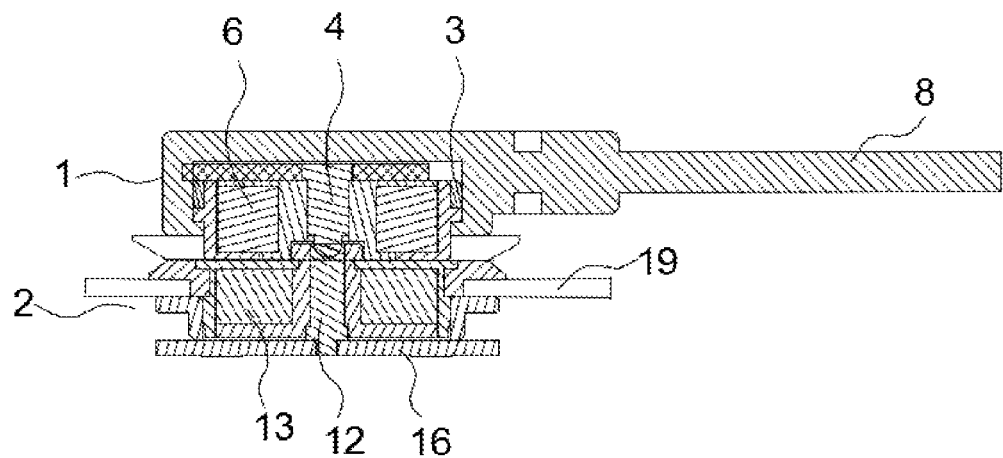
FIGS. 8a and 8b are structural views of a magnetic connection assembly according to an embodiment of the present invention, in which a first magnetic connector in FIG. 8a is the magnetic connector in FIG. 1 and a second magnetic connector is the magnetic connector in FIG. 3.
Figure 8B:
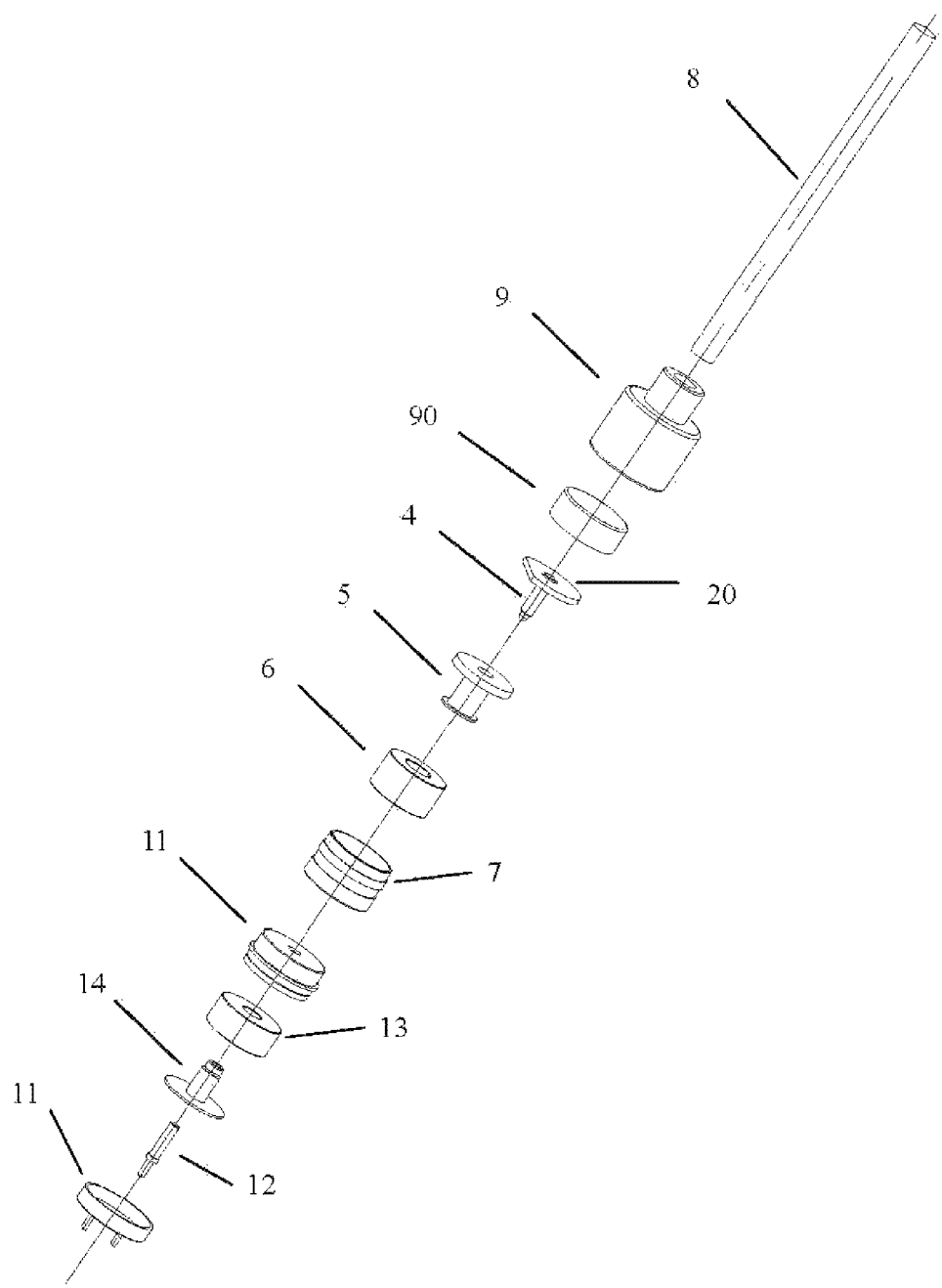

Referring to FIG. 8b, the circular magnetic connector may also include the first positive electrode conductor 4, the first insulator 5, the first magnet 6, the first negative electrode conductor 7, the PCB 20, an inner insulating cover 90, and the outer insulating cover 9. The magnetic connector in this embodiment does not include a latch. The components of the connector are shaped such that the first positive electrode conductor is received in a hollow portion of the first insulator, the first insulator is accommodated in a hollow portion of the first magnet, and the first positive electrode conductor, the first insulator and the first magnet are enclosed within the first negative electrode conductor, all of which are soldered (or by other fixing means) on the PCB 20.

Figure 17:
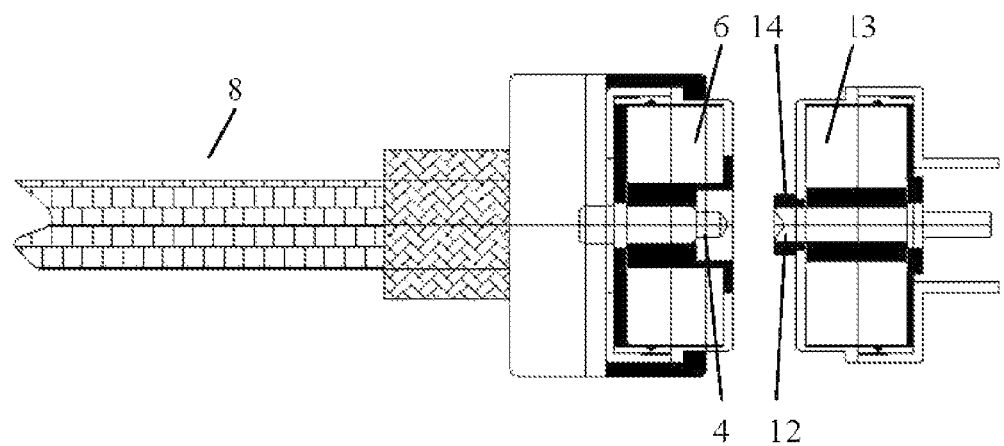
FIG. 17 is another embodiment of an outlet mode of the magnetic connector in accordance with the present invention.

In particular, a wiring harness 8 may be drawn outwards from the cylindrical side of the outer insulating cover 9, one end of which is connected to the PCB 20 in the body, and the other end of which may be equipped with various interfaces for electrical connection with other external devices. Alternatively, the wiring harness 8 may be led outwards from the top circular surface of the outer insulating cover 9, as shown in FIG. 17. The wiring harness 8 and the magnetic connector 1 may thus form a magnetic connection 40.

Referring to FIG. 2, it can be seen that the first insulator 5 is concave at an end of the first positive electrode conductor 4, forming a circular recess (i.e., a limiting hole) that can receive a portion of a second insulator of an external magnetic connector which embraces an external second conductive terminal (equivalent to at least a portion of the second conductive terminal) when the second conductive terminal contacts (in the manner of abutting joint or plugging-contact or the like) the first conductive terminal (i.e., the first positive electrode conductor 4) of the magnetic connector in this embodiment along an extending direction of the first positive electrode conductor 4 (hereinafter referred to as an axial direction). This prevents the second conductive terminal of the other magnetic connector, which is in contact with the magnetic connector in this embodiment by attraction between the magnets, from moving in a direction transverse to the axial direction or along a surface of the peripheral insulator 21. That is, the connection stability of two magnetic connectors can be improved.

Figure 3:
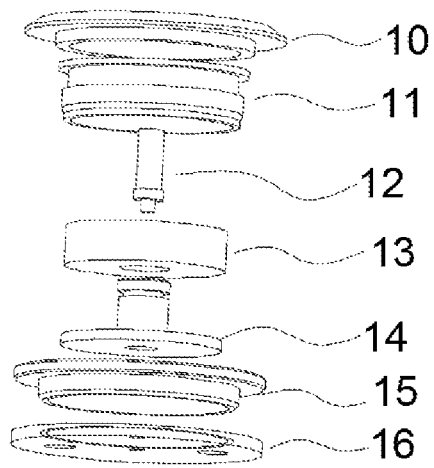
FIG. 3 is an exploded view of a magnetic connector according to a second embodiment of the present invention.
Figure 4:
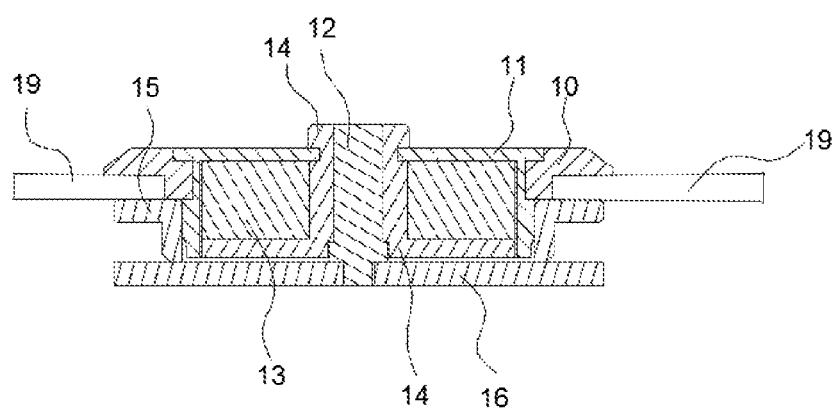
FIG. 4 is a cross-sectional view of the magnetic connector of FIG. 3.

The above magnetic connector can serve as a male base, while a magnetic connector 2 according to a second embodiment of the present invention shown in FIGS. 3 and 4 can serve as a female base which can be used with the magnetic connector 1 in FIGS. 1 and 2 cooperatively. As shown in FIG. 3, the magnetic connector which is also circular includes a second peripheral insulator 10, a second negative electrode conductor 11, a second positive electrode conductor 12, a second magnet 13, a second insulator 14, a second latch 15 and a PCB 16. In this embodiment, the body and the mounting cavity are not shown.

The PCB 16 is received in the bottom of the mounting cavity. An opening of the mounting cavity is towards the second peripheral insulator 10. In this embodiment, the second positive electrode conductor 12 is a second conductive terminal disposed on a side of the PCB 16 towards the second peripheral insulator 10 and located at the center of the circular PCB. The second magnet 13 has a hollow cylindrical shape and is arranged on the same side of the PCB 16 as the first conductive terminal. The hollow portion of the second magnet 13 embraces the second positive electrode conductor. In other words, the second positive electrode conductor extends through the hollow portion of the second magnet. The second insulator 14 is a second detachment prevention device dedicated to the second positive electrode conductor 12. Like the magnetic connector 1 in the first embodiment, the insulator is in the shape of a top-hollow "hat" comprising a hollow cylinder and a circular portion adjoining to the hollow cylinder. The hollow cylinder encloses the second positive electrode conductor 12. The circular portion prevents the second magnet 13 from contacting the PCB 16. The center of the circular portion is hollow for passing the second positive electrode conductor. The second negative electrode conductor 11 surrounds the second conductive terminal 12, the second magnet 13 and the second insulator 14. The second latch 15 and the second negative electrode conductive body 11 are electrically connected by a snap fit and soldered together with the PCB 16 to form a negative electrode of a circuit. The second peripheral insulator 10, the second negative electrode conductor 11, the second magnet 13 and the second insulator 14 may be integrally injection-molded. The second positive electrode conductor 12, the second latch 15 and the PCB 16 may be soldered together. The injection-molded portion and the soldered portion are locked together. The second outer insulating cover 18 (shown in FIGS. 5-7) and the peripheral insulator 10 enclose all of the above components in the mounting cavity of the body to prevent electric leakage.

The circular magnetic connector 2 may also include the second negative electrode conductor 11, the second positive electrode conductor 12, the second magnet 13, the second insulator 14, and the PCB 16. In particular, the second negative electrode conductor is divided into two parts, the bottom of which is in the form of a copper ring. It is easy to manufacture the negative electrode conductor of the female base since it has been divided into two separate parts. Alternatively, these two parts can be assembled by riveting when they are placed respectively on the front and back surfaces of a garment.

Referring to FIG. 4, it can be seen that the second insulator 14 protrudes at an end of the second positive electrode conductor 12. That is, a portion of the second insulator 14, which surrounds the second conductive terminal, protrudes with respect to a plane where the second magnet 13 locates. The portion of the second insulator enclosing the end of the second conductive terminal 12 that forms the protrusion may be inserted into a recess, for example the limiting hole, of another magnetic connector (male base), when the second conductive terminal is in contact with a first conductive terminal of the male base in an axial direction of the first conductive terminal in the manner of abutting joint or plugging-contact etc.). In this way it can prevents the connection formed by attraction between the male base and the female base through the magnets from moving in a direction transverse to the axial direction or along a surface of the peripheral insulator.

It should be noted that the positive electrode conductor of the magnetic connector is soldered onto the PCB to form a positive electrode of a circuit and the negative electrode conductor is soldered or riveted on the PCB to form a negative electrode of the circuit. When the male base is in contact with the female base, one positive electrode conductor must contact the other positive electrode conductor and one negative electrode conductor must contact the other negative electrode conductor, otherwise short-circuit may occur in the circuit.

In the embodiment of the present invention, the first conductive terminal may be a POGO PIN, and the second conductive terminal may be in the form of a socket that can be plugged.

In use, the male base 1 and the female base 2 are connected together to form conduction by a mutual attraction between the magnets. Both of the conductive terminals of the male base 1 and the female base 2 are abutted conducting through the attraction of the magnets and thus conductive. The recess of the male base and the protrusion of the female base may match and engage with each other. Therefore, the anti-off devices of the male base and the female base make the connection therebetween stable, so that the connection between the conductive terminals of the two bases is stable.

The female base 2 or the male base 1 can be fixed on a carrier 19 (FIGS. 4-8) by perforating them as a button. The carrier 19 can be a housing of a wearable device or a wearable garment. The beneficial effects are that the male base or the female base is installed on a garment or a wearable housing so as to be charged in time as required, and can be used as a decoration such as a button when not in use, which is convenient for carrying and quick application.

The beneficial effect of the above structure is that magnets are arranged in the structures of the magnetic connector 2 (female base) and the magnetic connector 1 (male base), which not only serve to attract each other so as to enable the male base and the female base to be firmly connected, but can also realize circuit or data conduction and charging functions.

Figure 5:
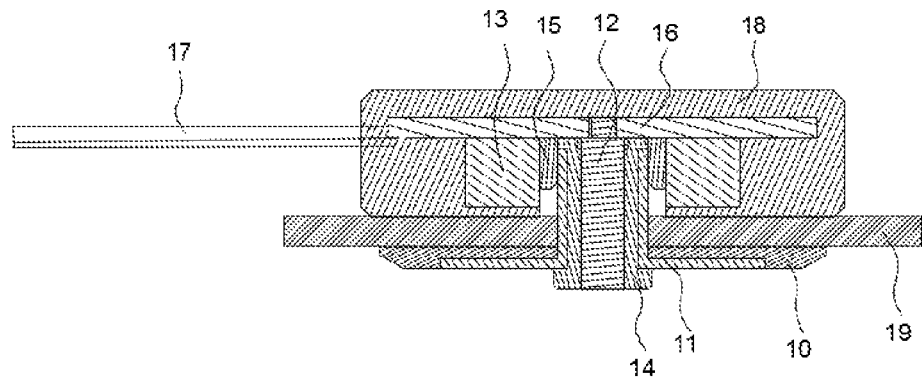
FIG. 5 is a cross-sectional view of a magnetic connector female base according to another embodiment of the present invention.
Figure 6:
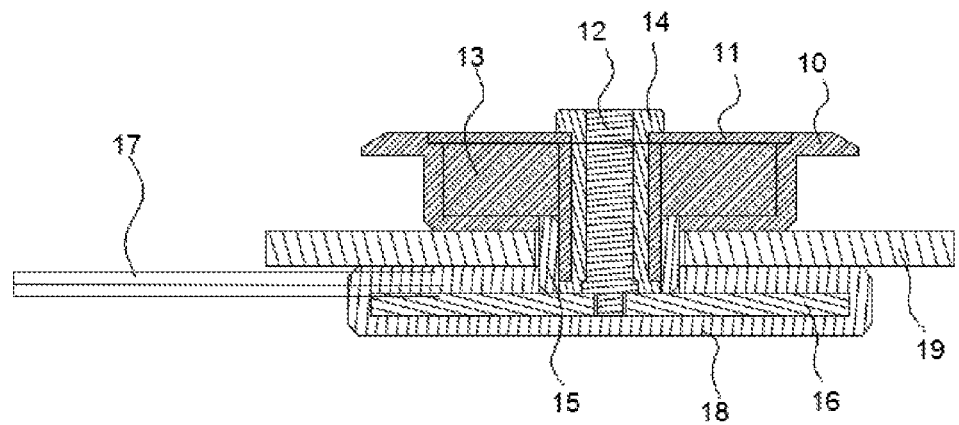
FIG. 6 is a cross-sectional view of a magnetic connector female base according to another embodiment of the present invention.
Figure 7:
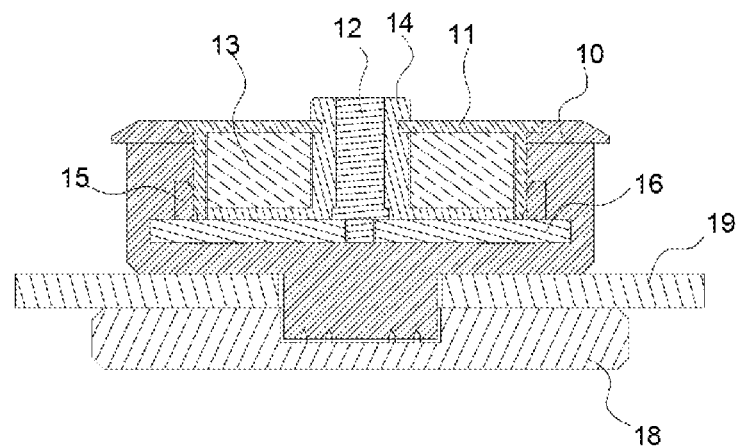
FIG. 7 is a cross-sectional view of a magnetic connector female base according to another embodiment of the present invention.

FIGS. 5-7 schematically show a magnetic connector as a female base in accordance with another embodiment of the present invention.

In particular, the second peripheral insulator 10, the second negative electrode conductor 11, the second magnet 13 and the second insulator 14 of the magnetic connector 2 (female base) are injection-molded as a first component. The second positive electrode conductor 12, the second latch 15 and the second PCB 16 are soldered to a second component. The first component and the second component may be locked and connected together by ultrasonic welding or riveting.

In particular, the female base 2 may be provided on the carrier 19. The carrier 19 may be a cloth or plastic housing. The carrier 19 may be set between the first component and the second component of the magnetic connector 2. In addition to fixing the carrier, the first component and the second component can form a negative electrode of a circuit through a snap fit between them.

In particular, the first peripheral insulator 21, the first insulator 5, the first negative electrode conductor 7 and the first magnet 6 of the male base 1 are connected as a third component. The first PCB 20, the wiring harness 8, the first positive electrode conductor 4 and the first outer insulating cover 9 are connected as a fourth component. The carrier 19 may be positioned between the third component and the fourth component of the male base 1.

In particular, the carrier 19 may be provided between the second peripheral insulator 10 and the second outer insulating cover 18 of the female base 2.

In particular, the carrier 19 may be provided between the second peripheral insulator 10 and the second latch 15.

The material of the latch may be brass. The material of the magnet may be aluminum-ferrum-boron. The components can ensure the strength while the thickness keeps small, so that the male base and the female base are more structurally fit to reduce space volume.

The structure of the (female) magnetic connector 2 can have several different installation methods. In different installation methods, there are slight changes in the volume and structure of the product itself, and the openings in the garment are different in size.

In the first mode, as shown in FIG. 4, the second negative electrode conductor 11 is placed into a mold for injection-molding to form the second peripheral insulator 10. The second magnet 13 is placed in a cavity of the second negative electrode conductor 11. Then the combination of the second negative electrode conductor 11, the second peripheral insulator 10 and the second magnet 13 is placed into the mold for injection molding to form the second insulator 14. The second PCB 16 and the second latch 15 are placed with a fixture and subject to reflow welding. The second positive electrode conductor 12 is soldered to a combination of the second PCB 16 and the second latch 15. The second negative electrode conductor 11, the second peripheral insulator 10 and the second magnet 13 as a first component and the second positive electrode conductor 12, the second PCB 16 and the second latch 15 as a second component are riveted together. In use, the garment is placed into the second component. Then the first component and the second component are riveted together to achieve conduction of positive and negative electrodes and charging or data transmission.

In the second mode, as shown in FIG. 5, the second peripheral insulator 10 is formed through injection-molding by placing the second negative electrode conductor 11 into a mold. Then the molded second negative electrode conductor 11 and the second peripheral insulator 10 are placed into the mold to perform injection molding for the second time to form the second insulator 14. The above parts belong to a first component. The second latch 15 is pasted on the second PCB 16 and subject to reflow welding. Then the second positive electrode conductor 12 is soldered to the second PCB 16 and the second magnet 13 is installed on the second PCB 16, both of which are fixed by the second latch 15 to form a subassembly which is then placed into the mold to obtain the second outer insulating cover 18 through injection-mold. These parts belong to a second component. In use, the garment is placed between the parts of the second component. Then the first component and the second component are riveted together to achieve conduction of the positive and negative electrodes and charging. Compared with the structure shown in FIG. 4, the magnetic connector in this mode is different in that the abutting surface for conduction is thinned, and the diameter of the opening for installing the cloth is changed from 8 mm to 4 mm.

In the third mode, as shown in FIG. 6, the second peripheral insulator 10 is formed through injection-molding, by placing the second negative electrode conductor 11 into a mold. The molded second negative electrode conductor 11 and the second peripheral insulator 10 are placed into the mold to perform injection molding for the second time and form the second insulator 14. The second magnet 13 is placed in a cavity of the second negative electrode conductor 11, both of which are then placed into the mold and rubber coated to form another layer of second peripheral insulator 10, thereby forming a first component. The second latch 15 is pasted on the second PCB 16 and subject to reflow welding. Then the second positive electrode conductor 12 is soldered to the second PCB 16, and then placed into the mold for injection molding the second outer insulating cover 18, thus forming a second component. With the first component and the second component assembled in the above mode, the garment is placed between the parts of the second component in use. The first component and the second component are then riveted together to form a unit for charging or data transmission. Compared with the structures of the above two modes, the second outer insulating cover 18 is thinned while the opening of the cloth is smaller.

For any of the above three modes, whether male base or female base, the installed second wiring harness 17 is located outside the garment, and an internal electrical conductor of the garment is fastened onto the external second negative electrode conductor 11, while an external negative ring conductor is soldered to the second PCB 16.

In a fourth mode, as shown in FIG. 7, the second peripheral insulator 10 is formed through injection-molding by placing the second negative electrode conductor 11 into a mold. The second magnet 13 is placed in a cavity of the second negative electrode conductor 11 and then placed into the mold to perform injection molding for second time so as to form the second insulator 14, thus obtaining a first component. The second latch 15 is installed on the second PCB 16 and subject to reflow welding. Then the second positive electrode conductor 12 is soldered to the second PCB 16. The second positive electrode conductor 12, the second PCB 16 and the second latch 15 form a second component. The first component and the second component are riveted together. All the riveted components are placed in the mold for rubber coating to mold the second peripheral insulator 10. The second outer insulating cover 18 is an injection-molded plastic part and performs ultrasound with the second peripheral insulator 10 to clamp the garment, i.e., the carrier 19. With respect to the first mode, the outlet method and the opening size of the garment in this mode are changed, which is beautiful in appearance and more practical.

Figure 9:
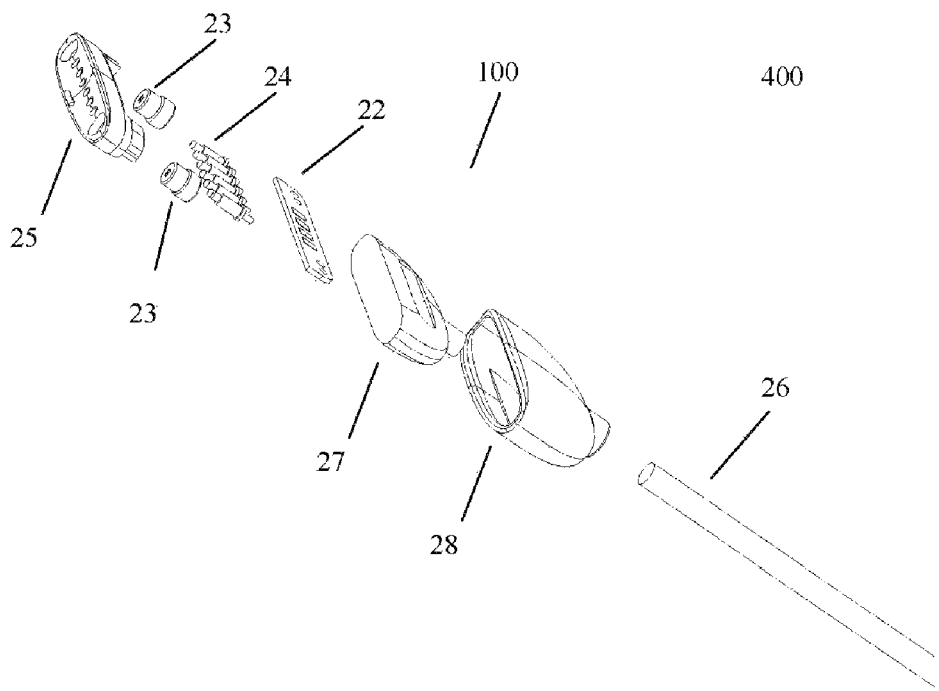
FIG. 9 is an exploded view of a magnetic connector according to a third embodiment of the present invention.
Figure 10:
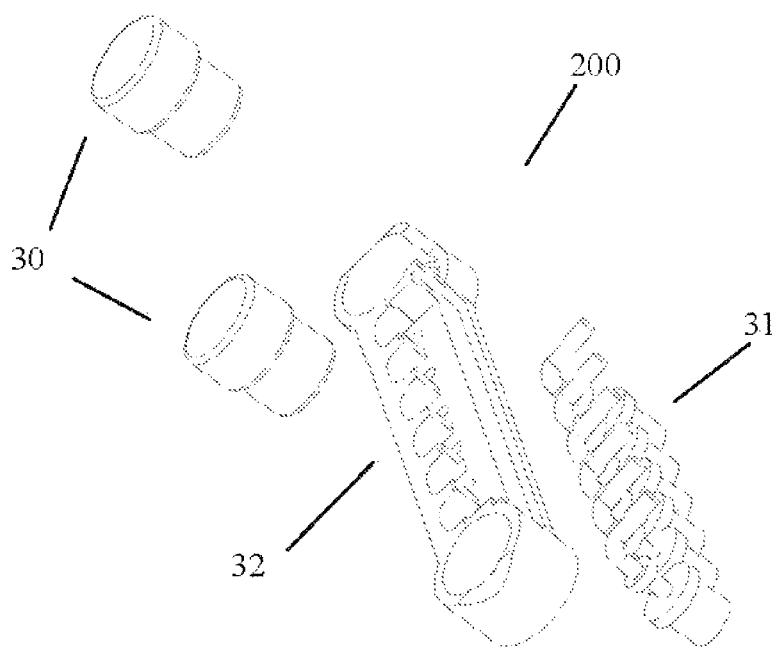
FIG. 10 is an exploded view of a magnetic connector according to a fourth embodiment of the present invention.

FIGS. 9 and 10 show a third embodiment and a fourth embodiment of the magnetic connector in accordance with the present invention. As shown in FIG. 9, in this embodiment, a magnetic connector 100 (male base) is in the shape of square. The magnetic connector includes a PCB 22, a first magnet 23, a first conductive terminal 24, a first insulating bracket 25, an inner insulating cover 27, and an outer insulating cover 28.

The inner insulating cover 27 forms a body of the magnetic connector in this embodiment. The body has a mounting cavity (not shown). The PCB 22 is received at the bottom of the mounting cavity. The PCB 22 has a rectangular structure (which may have rounded or not rounded corners) with a length direction and a width direction. Particularly, the length of the PCB 22 in the length direction is greater than that in the width direction. The first conductive terminal 24 including a number of posts are centrally positioned on a side of the PCB 22 towards the top of the mounting cavity and are arranged in rows along the length direction of the PCB with constant spaces. The first conductive terminal 24 extends towards the top of the mounting cavity. In this embodiment, the first conductive terminal comprised six posts. The first magnet 23 is located on the same side as the first conductive terminal 24 and includes two segments arranged on both sides of the first conductive terminal 24 in the width direction. The first magnet has a contact surfaces for mutual attraction with a contact surfaces of an external second magnet. The shape of the two segments of magnet can be cylindrical, square or other shapes as long as the contact surfaces are flat. The first insulating bracket (i.e., insulating bushing) 25 is a first anti-off dedicated to the first conductive terminal 24, and includes eight limiting holes (FIG. 9), of which the middle six holes are used to enclose the first conductive terminal 24, and the other two are used for embracing the first magnet 23. The outer insulating cover 28 may coat the inner insulating cover 27, to prevent leakage of electricity.

Figure 16:
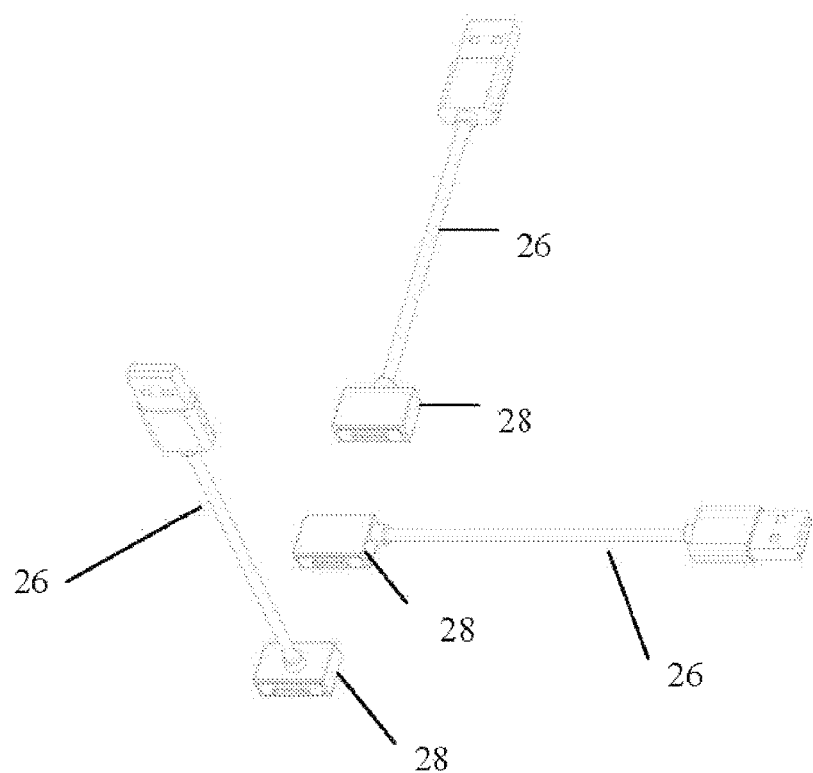
FIG. 16 is an embodiment of an outlet mode of the magnetic connector in accordance with the present invention.

In particular, a wiring harness 26 is drawn outwards from the surface of the outer insulating cover 28. One end of the wiring harness 26 is connected to the PCB 22 in the body, and the other end can be installed with various interfaces for electrical connection with other external devices. Optionally, the wiring harness 26 connecting the PCBs may be led out through holes in the inner insulating cover 27 and the outer insulating cover 28 in the length direction or the width direction or a direction opposite to the extending direction of the conductive terminal, as shown in FIG. 16. The wiring harness 26 and the magnetic connector 100 may thus constitute a magnetic connection 400.

Referring to FIG. 9, it can be seen that the first insulating bracket 25 is recessed inward relative to the extending direction of the first conductive terminal to form a recess. The recess may receive an external second conductive terminal or a portion of a device which embraces the end of the second conductive terminal (equivalent to at least a portion of the second conductive terminal) when the second conductive terminal is in contact with the first conductive terminal 24 of the magnetic connector according to this embodiment in the extending direction thereof (hereinafter referred to as an axial direction). This makes it possible to prevent a second conductive terminal or a second magnet of another magnetic connector that is in contact with the magnetic connector in this embodiment by attraction between the magnets from moving in a direction transverse to the axial direction.

FIG. 10 shows a magnetic connector 200 as a female base according to a fourth embodiment of the present invention. The magnetic connector 200 matches the magnetic connector 100 in the third embodiment. The magnetic connector is also in a square shape. This magnetic connector includes at least a PCB 29, a second magnet 30, a second conductive terminal 31 and a second insulating bracket 32.

The magnetic connector includes a body having a mounting cavity (not shown). The PCB 29 is received in the bottom of the mounting cavity. The PCB 29 has a rectangular structure with a length direction and a width direction (which may also have rounded corners or not rounded corners). The length of the PCB 29 in the length direction is greater than the length in the width direction. The second conductive terminals 31 are centrally located on one side of the PCB 29 and arranged in rows along the length direction. In this embodiment, the way in which the second conductive terminal is in contact with an external first conductive terminal is plugging. That is, a part of the conductive terminal, which contacts the external first conductive terminal, is in the form of a pluggable socket. In particular, the conductive terminal comprises six posts. The second magnet 30 is located on the same side as the second conductive terminal and includes two segments arranged on both sides of the conductive terminal in the width direction. The two segments of the second magnet have the contact surfaces for mutual attraction with contact surfaces of an external first magnet. The shape of the two segments of the second magnet can be cylindrical, square or other shapes as long as the contact surfaces are flat. The second insulating bracket (bushing) 32 is a second detachment prevention device dedicated to the second conductive terminal 31 and the second magnet 30. The insulating bracket includes eight limiting holes, in which the middle six are used to surround the second conductive terminal 31, and the other two on the outer side are used to surround the second magnet 30.

Referring to FIG. 10, it can be seen that the second conductive terminal 31 and the second magnet 30 can protrude from the limiting hole of the second insulating bracket, so that when the external first conductive terminal contacts the second conductive terminal 31 of the magnetic connector 200 along the extending direction (hereinafter referred to as an axial direction) in this embodiment, it can be inserted into the recess of the insulation bushing of the first detachment prevention device. Preferably, the second conductive terminal and/or the second magnet may be inserted into the limiting holes in the insulating bushing (bracket) of the first anti-off device 25. This prevents the second conductive terminal or the second magnet from moving in a direction transverse to the axial direction when the magnetic connector 200 is in contact with another magnetic connector.

Figure 11:
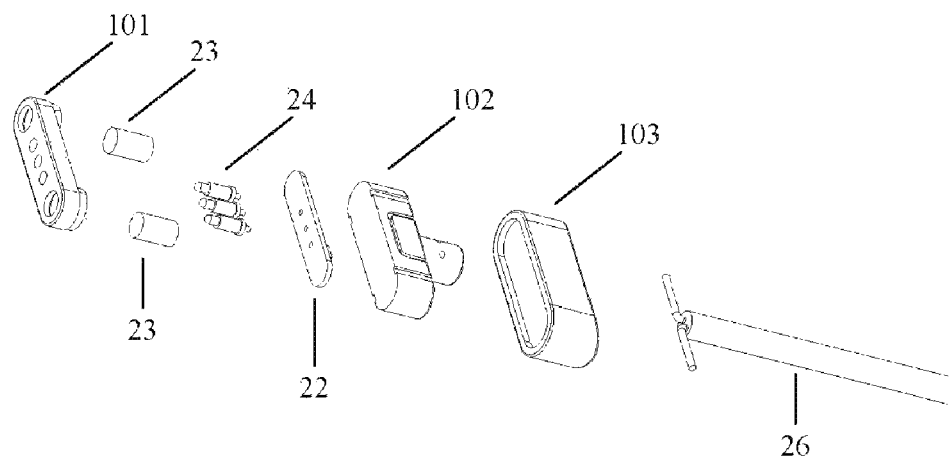
FIG. 11 is an exploded view of a magnetic connector according to yet another embodiment of the present invention.

FIGS. 11-14 schematically show other embodiments of the magnetic connector in accordance with the present invention. As shown in FIG. 11, the magnetic connector in this embodiment is different from the third embodiment in that: the conductive terminal comprises three posts; and the insulation bushing of the first anti-off device includes an insulating bracket 101, an inner insulating cover 102 and an outer insulating cover 103.

Figure 12A:
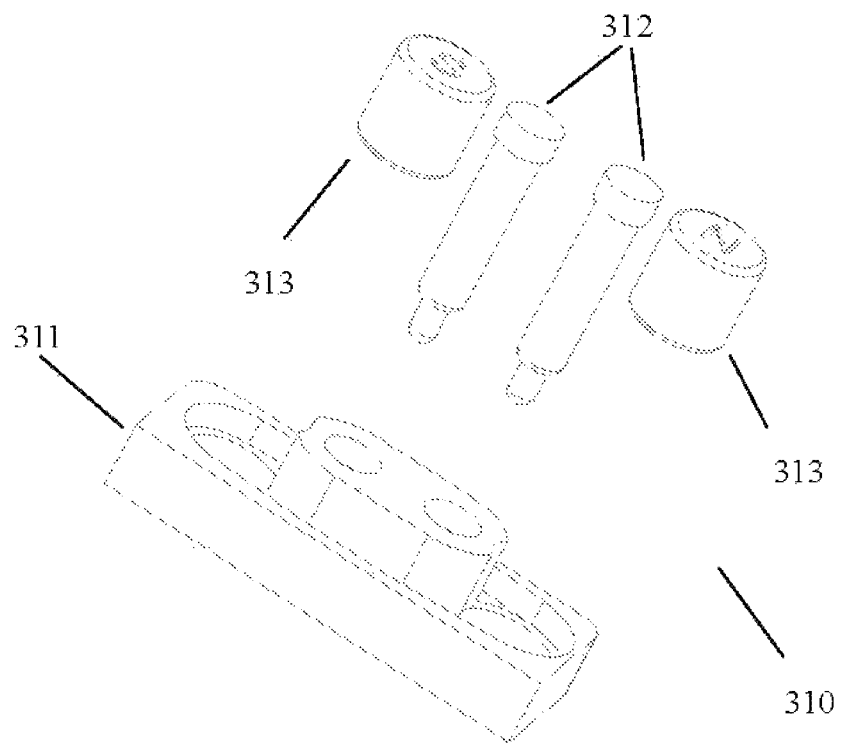
FIGS. 12a-12c are exploded views of a magnetic connector according to yet another embodiment of the present invention.
Figure 12B:
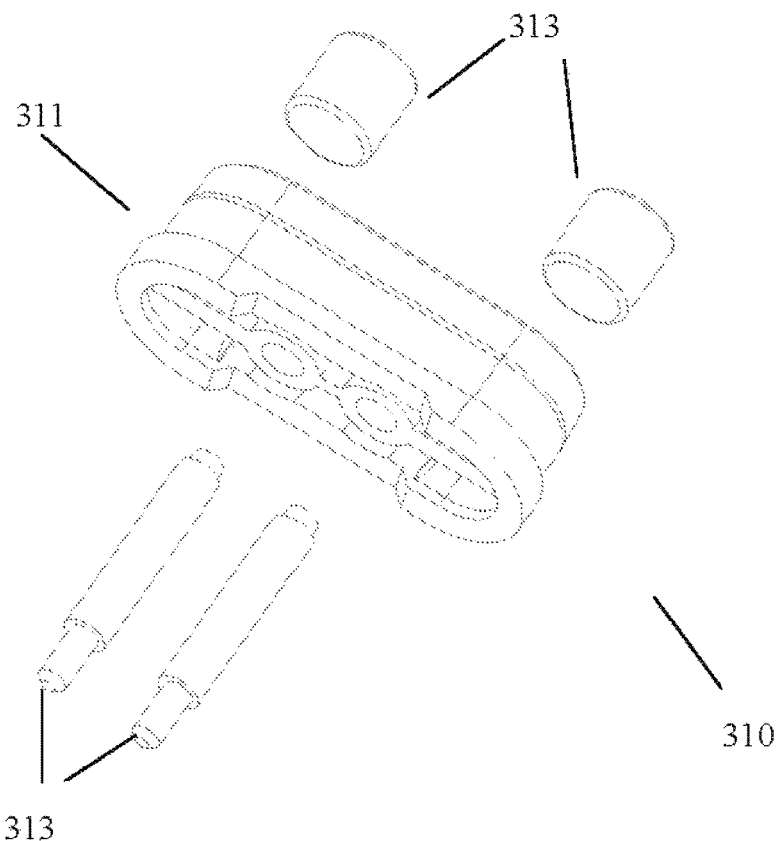
Figure 12C:
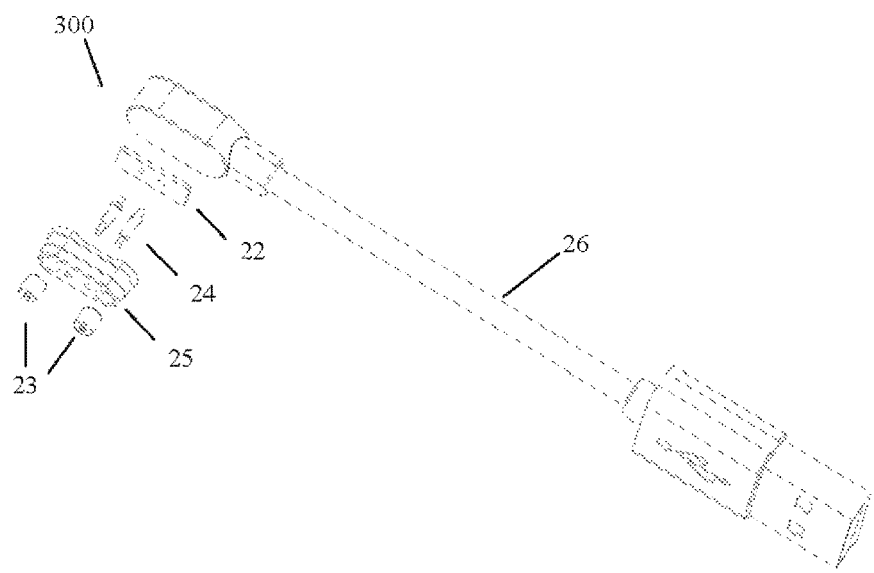

Referring to FIG. 12, the conductive terminals of a magnetic connector 300 (male base) and of a magnetic connector 310 (male base) in this embodiment each include two posts. The female base includes two kinds of structures. In particular, a portion 312 of an insulating bushing 311 embracing the second conductive terminal preferably protrudes with respect to a plane where a second magnet 313 locates, as shown in FIG. 12a, in which the protrusion portion is inserted into a recess (not shown) of an insulating bushing of the male base to form a fixation. In FIG. 12b, an insulating bushing of the female base does not protrude with respect to the plane where the second magnet 313 locates. When the female base is connected to the male base of FIG. 12c, the fixation is achieved in a socket form, namely, by inserting the first conductive terminal of the male base into the second conductive terminal of the female base. In particular, referring to FIG. 13, a first magnet in this embodiment is in the shape of hollow cylinder (i.e., in the shape of "racetrack") circling the first conductive terminal. The racetrack-shaped magnet can be soldered to a PCB by solder paste, which can effectively prevent the magnet from falling off. The magnet can also be fixed on a bracket by metal sleeve. In particular, a magnet of step type, i.e., a "U" shaped magnet may be used.

Figure 13:
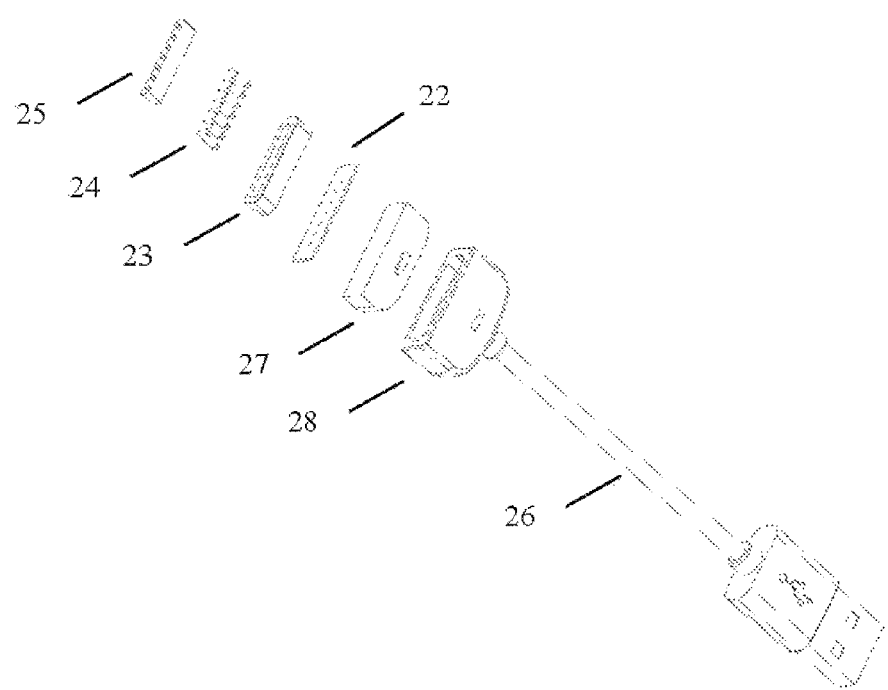
FIG. 13 is an exploded view of a magnetic connector according to yet another embodiment of the present invention.

In the magnetic connector (male base) shown in FIG. 13, the insulating bracket (bushing) is accommodated in a hollow portion of the magnet. The insulating bracket includes a plurality of limiting holes. The number of the limiting holes is the same as the number of the post in the first conductive terminal. The insulating bracket installed on the PCB is aligned with the magnet. The first conductive terminal protrudes through the respective limiting holes. A magnetic connector (not shown) corresponding to this male base may include second conductive terminal (similar to those in FIG. 10) in the form of socket so that the male and female bases are fixed by inserting the first conductive terminal into the second conductive terminal and may also include an insulating bracket with a plurality of limiting holes so that the first conductive terminal is inserted into the limiting hole of the female base to contact with the second conductive terminal located in the limiting hole, thus keeping a stable connection between the male and female connectors.

Figure 14:
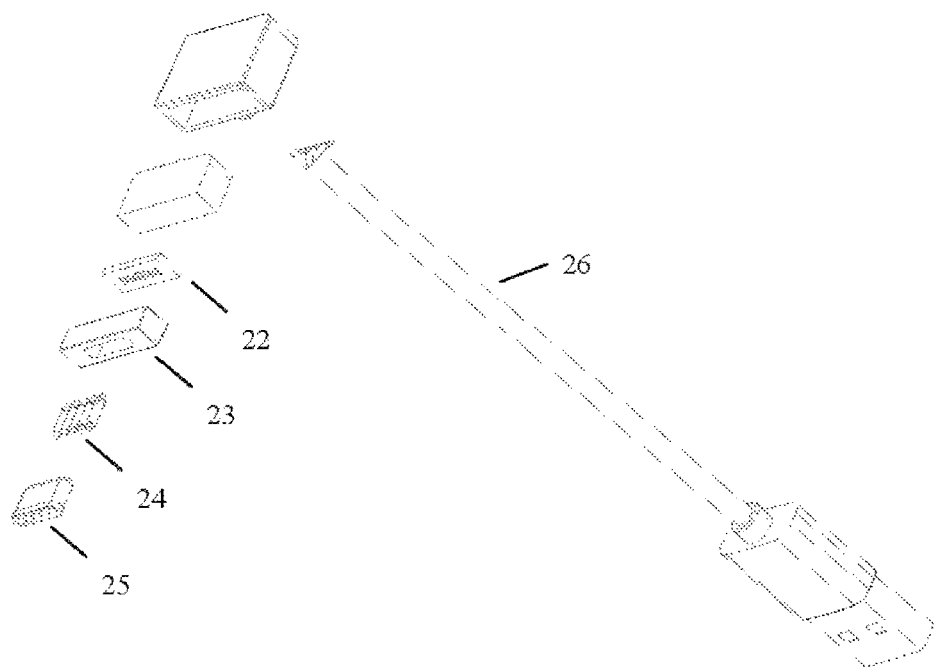
FIG. 14 is an exploded view of the magnetic connector according to yet another embodiment of the present invention.

FIG. 14 schematically shows a magnetic connector with five posts of conductive terminal. Similar to the magnet in FIG. 13, a magnet in FIG. 14 is also hollow cylindrical. The height of an insulating bracket installed on a PCB is higher than that of the magnet. In other words, the insulating bracket protrudes with respect to the plane where the magnet locates. Therefore, a magnetic connector matching the magnetic connector in FIG. 14 is configured such that the height of the insulating bracket is less than the height of the magnet so that the insulating bracket of the magnetic connector in FIG. 14 can be inserted into the hollow portion of the magnet.

The present invention also provides a magnetic connection member. The magnetic connection member includes a magnetic connector as male base and a wiring harness in any one of the above embodiments. One end of the wiring harness is connected to a PCB of the magnetic connector, and the other end has, for example, a USB interface connected to an external device.

The present invention further provides a magnetic connection assembly. The magnetic connection assembly includes a first magnetic connector and a second magnetic connector matching with each other and a wiring harness connected to the first magnetic connector. The first magnetic connector may be the male base in the embodiment of the present invention, and the second magnetic connector may be the female base in the embodiment of the present invention. One end of the wiring harness is connected to a PCB in the first magnetic connector, and the other end can be equipped with various interfaces such as various USB ports for electrical connection with other external devices.

For example, referring to FIGS. 8a and 8b, a magnetic connection assembly is shown with the magnetic connector being circular. In FIG. 8a, a portion of the insulating bushing of the female base, which surrounds the second conductive terminal 12, protrudes with respect to a plane where the second magnet 13 is. Accordingly, the insulating bushing of the male base is configured to receive the portion of the insulating bushing of the female base which surrounds the second conductive terminal 12 when the first conductive terminal 4 is in contact with the second conductive terminal 12 of the female base oppositely in an axial direction and forms conduction to limit displacement of the second conductive terminal in a direction transverse to the axial direction.

As another example, referring to FIGS. 9 and 10, there is shown a magnetic connection assembly when the magnetic connector is square. Optionally, the second conductive terminal 31 of the female base protrudes from the second limiting hole. Accordingly, the insulating bushing of the male base is configured to receive at least a portion of the second conductive terminal 12 of the female base (the portion protruding from the second limiting hole) when the first conductive terminal 24 is in contact with the second conductive terminal 12 oppositely in an axial direction and forms conduction to limit displacement of the second conductive terminal 12 in a direction transverse to the axial direction.

Optionally, the second magnet 13 of the female base protrudes from the second limiting hole. The insulating bushing of the male base is accordingly configured to receive at least a portion of the second magnet 13 (i.e., the portion protruding from the second limiting hole) when the first magnet 25 is magnetically attracted to the second magnet 13 of the female base oppositely in an axial direction to limit displacement of the second magnet 13 in a direction transverse to the axial direction.

In an embodiment where the magnetic connector is square, the conductive terminal (whether the first conductive terminal or the second conductive terminal) includes a positive pole posts and a negative pole posts. When the number of the posts (at least two) is odd, the negative pole post(s) may be arranged in the center of the PCB and the positive pole post(s) may be symmetrically arranged with respect to the negative pole post(s). The two segments of the magnet arranged on both sides of the conductive terminal have the same magnetic poles. For example, referring to FIG. 13, the middlemost post among the seven posts is negative, and the remaining three left posts and three right posts are positive all. Each two segments of the magnet on both sides of the conductive terminal are the same type of N poles or S poles. Alternatively, referring to FIG. 11, the middle of the three posts is negative, and the posts at both sides are positive. In this way, the magnetic connector can be connected to another matched magnetic connector without distinguishing the connecting direction of the conductive terminals, so that a USB function capable of charging and transmitting data on the front and back surfaces can be realized.

The conductive terminals may further include the post(s) for data transmission. When the number of the post of conductive terminal is odd, the magnetic connector can also be used unidirectionally. For example, referring to FIG. 11, the post in the middle may be a data port, and the remaining posts on both sides are negative and positive respectively. This arrangement with more data transmission interfaces (i.e., data ports) can achieve more functions to data transfer.

In the above embodiment, the two segments of magnet arranged on both sides of the conductive terminal may have different poles, especially when the conductive terminal is provided with data ports as described above. In this way, when two magnetic connectors (male base and female base) are connected together, a user does not need to care whether the connection direction of the two magnetic connectors is correct or not. According to the principle that "like poles repel but opposite poles attract", the magnets of two magnetic connectors can automatically identify the attraction direction and form a connection, playing a foolproof role.

Figure 15:
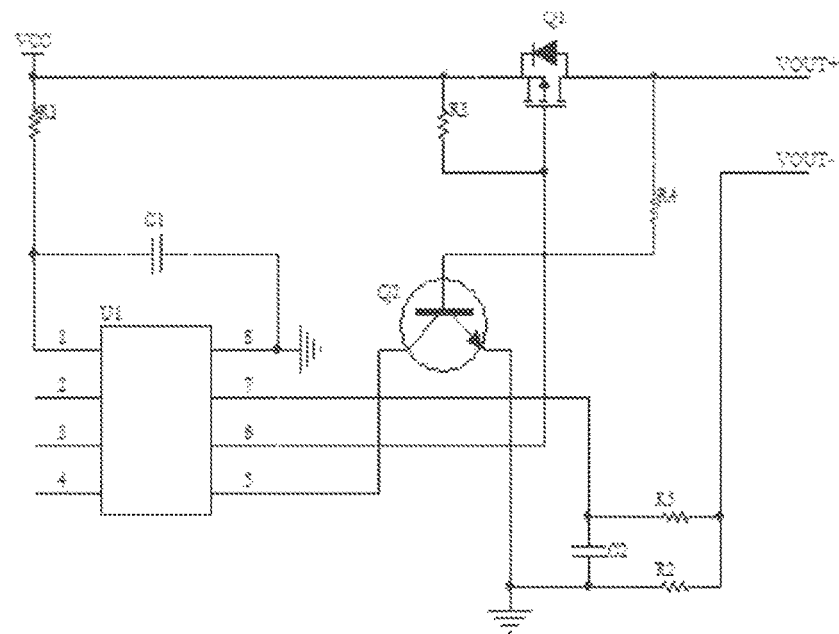
FIG. 15 is a circuit diagram of a short-circuit protection circuit according to an embodiment of the present invention.

A short-circuit protection circuit can also be arranged between the positive electrode conductor and the negative electrode conductor of the conductive terminal, as shown in FIG. 15, to realize overcurrent and short circuit protection functions. The circuit consists of three parts, including a main chip U1 controlling switch output and a sampling of the output state, a switch MOS tube Q1 being connected to the output, and a switch Q2 being connected to the output to check the output status. Resistors R2, R5 and capacitor C5 form a sampling loop of the output current. When output load over-current occurs, an output current flows across R2 to form a voltage drop. The voltage drop is provided to pin 7 of U1 after being limited by R5 and filtered by C5. When the voltage is high to a certain extent, U1 adjusts output with PWM control through pin 7, and adjusts the on-time of Q1 to control the magnitude of the output current to achieve output over-current protection. When output load short-circuit occurs, voltage VOUT+ changes. When the voltage is lower than a certain value in a short time, the voltage flows through R4 to Q2 and will be rapidly shown in pin 5 of U1. U1 turns off Q1 by controlling pin 6 after performing data determination, to achieve short circuit protection.

Figure 18:
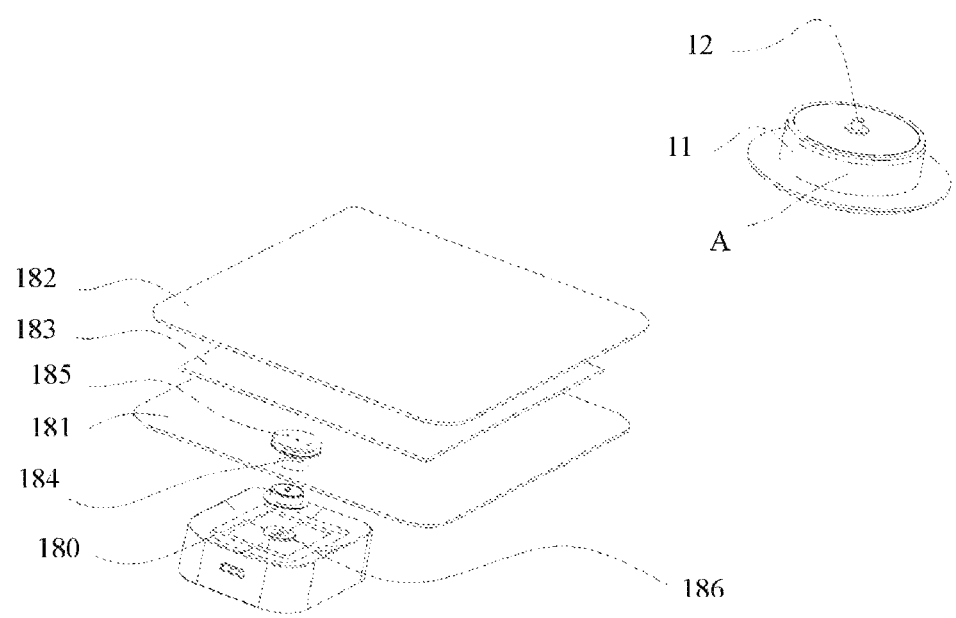
FIG. 18 is an embodiment of a garment or protective clothing for intelligent heating in accordance with the present invention.

FIGS. 18 and 19 show two embodiments of a garment or protective clothing for intelligent heating in accordance with the present invention. As shown in FIG. 18, a heating unit is fixed between a first carrier 181 and a second carrier 182 without exposing from the second carrier. A heating component 183 and a magnetic connector are connected together by a wiring harness. The first carrier or the second carrier is provided with a via hole 184 at an arbitrary position. The diameter of via hole is larger than an outer diameter A of a body 180 of the magnetic connector. The outer diameter A passes through, for example, the via hole 184 disposed on the first carrier. The body 180 of the magnetic connector is fixed on the first carrier (being clamped between the rear cover 185 and the body of the magnetic connector and being not easy to fall off) by riveting pressure. The rear cover and the body of the magnetic connector are fixed on the first carrier by interference riveting. If the polarity of the magnetic connector on the carrier is N pole, the polarity on a power supply device 186 (equipped with a magnet battery box and a magnet wire) is S. When the power supply device is close to the magnetic connector on the heating product, the two magnets will generate an attraction force and thus the power supply device is firmly attracted on the carrier. The battery box has a power switch and a current control device. The user can adjust the temperature through a temperature control device or perform other control operations. The PCB on the rear cover of the magnetic connector can have temperature detection and temperature protection functions. The PCB on the rear cover of the magnetic connector can further have a Bluetooth control circuit. The heating product can be controlled and adjusted by a cable with a temperature control switch function. The heating product can perform temperature control with a mobile power supply having a temperature control function. Particularly, the conductive terminal of the magnetic connector includes at least two PINs. In the heating product, the switch is assembled on the first carrier.

Figure 19A:
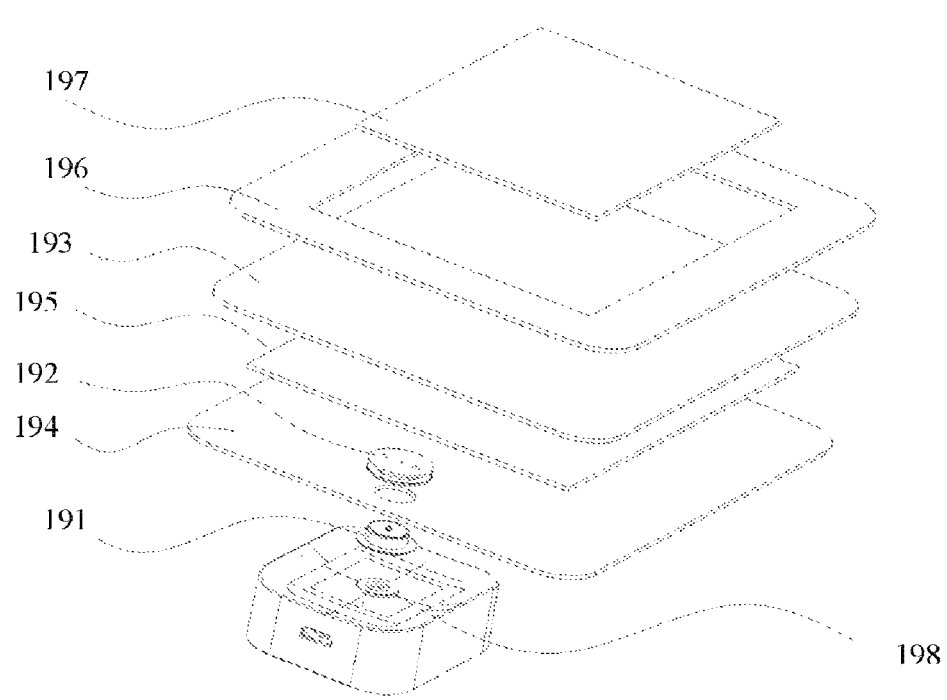
FIGS. 19a and 19b show other embodiments of a garment or protective clothing for intelligent heating in accordance with the present invention.

As shown in FIG. 19a, a first magnet interface 191 and a second magnet interface 192 are fixed to a first fabric sheet 193 by riveting. A heating sheet 195 is soldered to the second magnet interface. The first fabric sheet 193 and a second fabric sheet 194 fix and bond the heating sheet. The other side of the first fabric sheet is affixed with a silicone sheet 196, which can be affixed to human skin. A tablet 197 is placed in the middle gap of the silicone sheet. After power is supplied to the magnet interfaces (the first magnet interface and the second magnet interface) by a power supply device 198, the heating sheet begins to generate heat and reaches a constant temperature. The heating sheet then heats the medicine tablet and maintains the temperature to exert the maximal efficacy.

Figure 19B:
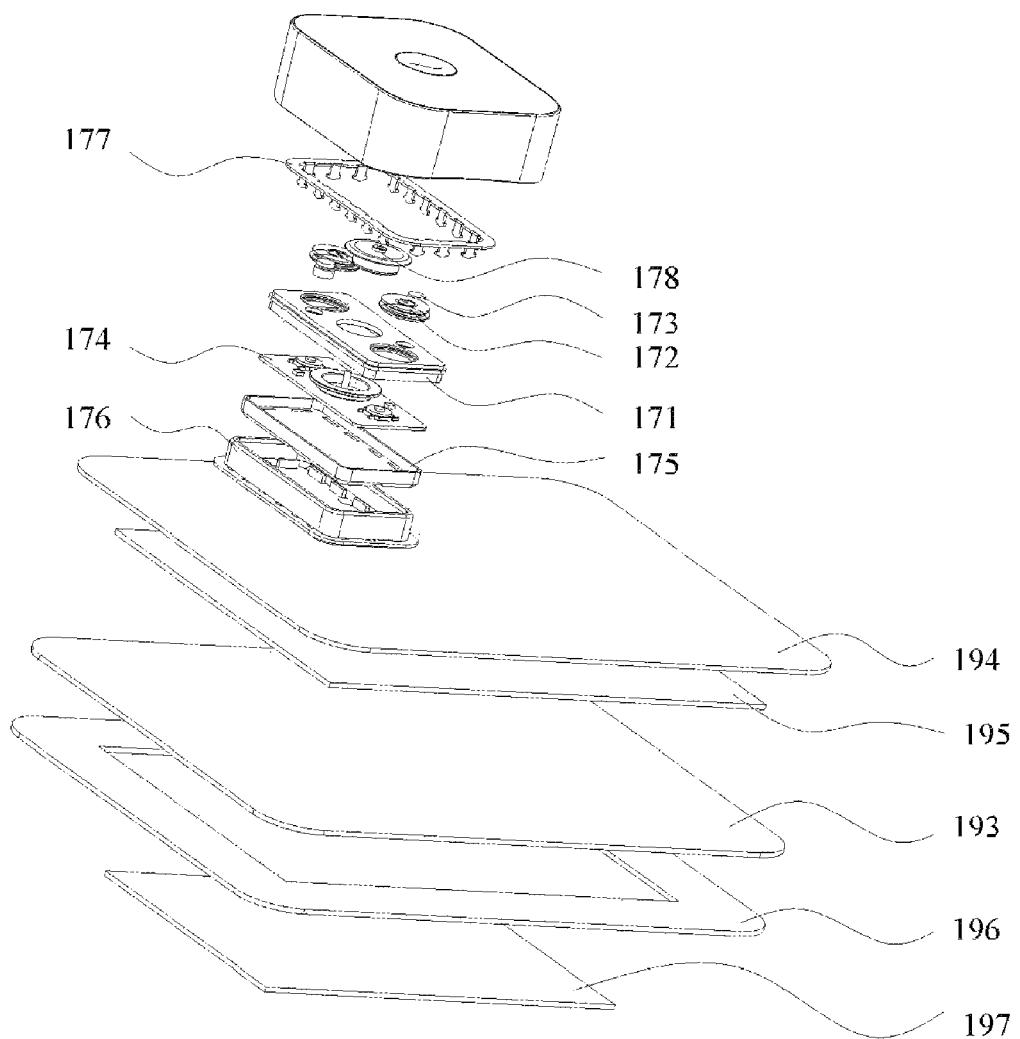

Refer to FIG. 19b, showing a structural view of a controller 170 of the magnetic connector of FIG. 19b. The controller 170 includes an upper case 171, a switch button 172, an indicator light 173, a PCBA 174, an encapsulating inner mold 175, an encapsulating outer mold 176, and a hardware steel piece 177. After power is supplied to a magnetic input interface 178 (including the first magnet interface 191 and the second magnet interface 192), the controller controls the heating sheet to generate heat and heat the medicine tablet and maintain the temperature so as to maximize the efficacy of the tablet.

The preparation method is as follows:
1. injection-molding the upper case by hard plastic;
2. placing the injection-molded upper case into a mold, and injection-molding a soft plastic switch button and indicator light;
3. assembling the PCBA, which is provided with a control circuit, a magnetic input interface, and an output;
4. injection-molding the encapsulating inner mold;
5. injection-molding the encapsulating outer mold;
6. assembling the hardware steel piece which is provided with riveting openings;
7. fixing the controller on the first fabric sheet by means of riveting;
8. soldering the heating sheet onto the controller;
9. fixing and adhering the heating sheet to the first fabric sheet and the second fabric sheet;
10. adhering the silicone sheet on the other side of the first fabric sheet, in which the silicone sheet can be sticky to human skin; and
11. placing the tablet in the middle gap of the silicone sheet.

The above embodiments are merely intended for describing the technical solutions of the present invention, but not for limiting the present invention. Although the present invention is described in detail with reference to the foregoing embodiments, it should be understood by those skilled in the art that the technical solutions recorded in the foregoing embodiments can be modified, or some of the technical features can be replaced equivalently. These modifications or replacements do not make the essence of the corresponding technical solutions depart from the spirit and scope of the technical solutions of the embodiments of the present invention.

What is claimed is:

1. A magnetic connector comprising a body having a mounting cavity, the body comprising:
   a PCB received in the mounting cavity;
   a first conductive terminal soldered on a side of the PCB and extending toward an opening of the mounting cavity; and
   a first magnet disposed along the periphery of the PCB and on the same side as the first conductive terminal;
   wherein the body is further provided with a first anti-off device dedicated to the first conductive terminal or the first magnet to prevent point detachment, the first anti-off device being provided with an insulating bushing embracing the first conductive terminal or the first magnet, the first conductive terminal or the first magnet being placed in a first limiting hole of the insulating bushing, and the insulating bushing is configured to:
   receive at least a portion of an external matching second conductive terminal when the first conductive terminal is in contact with the second conductive terminal oppositely in an axial direction and forms electric conduction to limit displacement of the second conductive terminal in a direction transverse to the axial direction; or
   receive at least a portion of an external matching second magnet when the first magnet is magnetically attracted to the second magnet oppositely in an axial direction to limit displacement of the second magnet in a direction transverse to the axial direction.

2. The magnetic connector according to claim 1, wherein the body is circular; the first anti-off device comprises an insulator dedicated to the first conductive terminal;
   the first magnet is annular; and the first conductive terminal is a spring probe.

3. The magnetic connector according to claim 1, wherein body is of square shape; the first anti-off device comprises an insulating bracket dedicated to the first magnet; and the first magnet is located on either side of the square body.

4. The magnetic connector according to claim 1, wherein the body is of square shape; the first anti-off device includes an insulating bracket dedicated to the first conductive terminal; and the first magnet is hollow cylindrical.

5. A magnetic connector comprising a body, the body comprising:
   a PCB,
   a second conductive terminal soldered to a side of the PCB, and
   a second magnet disposed along the periphery of the PCB and on the same side as the second conductive terminal;
   wherein the body is further provided with a second anti-off device dedicated to the second conductive terminal or the second magnet; the second anti-off device is formed with an insulating bushing embracing the second conductive terminal or the second magnet; the second conductive terminal or the second magnet is located in a second limiting hole of the insulating bushing; and the insulating bushing is configured so that
   the second conductive terminal or the second magnet protrudes from the second limiting hole, or
   a portion of the insulating bushing surrounding the second conductive terminal, protrudes with respect to a plane where the second magnet locates.

6. The magnetic connector according to claim 5, wherein the body is circular; the second anti-off device comprises an insulator dedicated to the second conductive terminal; the second magnet is annular; and the second conductive terminal is a spring probe.

7. The magnetic connector according to claim 5, wherein body is square;
   the second anti-off device comprises an insulating bracket dedicated to the second magnet; and
   the second magnet locates on either side of the square body.

8. The magnetic connector according to claim 5, wherein the body is square; the second anti-off device comprises an insulating bracket dedicated to the second conductive terminal; and the second magnet is hollow cylindrical.

9. A garment or protective clothing for intelligent heating, comprising:
   a magnetic connector according to claim 5;
   a rear cover for locking with the magnetic connector;
   a first carrier and a second carrier, wherein the first carrier or the second carrier is provided with an opening, and the magnetic connector is locked with the rear cover through the opening and fixed on the first carrier or the second carrier; and
   a heating unit fixed between the first carrier and the second carrier and not exposed to the outside, wherein a heating part of the heating unit is connected to the magnetic connector through a wiring harness.

* * * * *